United States Patent [19]

Goronkin et al.

[11] Patent Number: 5,294,809
[45] Date of Patent: Mar. 15, 1994

[54] RESONANT TUNNELING DIODE WITH REDUCED VALLEY CURRENT

[75] Inventors: Herbert Goronkin, Tempe; Saied N. Tehrani, Scottsdale; Jun Shen, Phoenix; Xiaodong T. Zhu, Chandler, all of Ariz.

[73] Assignee: Motorola, Inc., Schaumburg, Ill.

[21] Appl. No.: 65,338

[22] Filed: May 24, 1993

[51] Int. Cl.$^5$ .......................................... H01L 29/88
[52] U.S. Cl. ........................................ 257/17; 257/25; 257/22; 257/23; 257/201
[58] Field of Search ............... 257/25, 17, 23, 22, 257/190, 201

[56] References Cited

U.S. PATENT DOCUMENTS 4,849,799  7/1989  Capasso et al. ............... 257/198 X
4,959,696  9/1990  Frensley et al. ................ 257/25 X

FOREIGN PATENT DOCUMENTS 2226916  7/1990  United Kingdom ................ 257/25

Primary Examiner—William Mintel
Attorney, Agent, or Firm—Eugene A. Parsons

[57] ABSTRACT

A resonant tunneling diode having a quantum well sandwiched between first and second tunnel barrier layers and the quantum well and tunnel barrier layers sandwiched between an injection layer and a collector layer. The improvement includes a relatively thin layer of semiconductor material sandwiched between either the first tunnel barrier layer and the injection layer or the first tunnel barrier layer and the quantum well. The thin semiconductor layer has a valence band with an energy level lower than the valence band of the first tunnel barrier layer so as to prevent minority carriers from travelling toward the injection layer.

14 Claims, 3 Drawing Sheets

RESONANT TUNNELING DIODE WITH REDUCED VALLEY CURRENT

FIELD OF THE INVENTION

The present invention pertains to resonant tunneling diodes and more specifically to resonant tunneling diodes with reduced valley current.

BACKGROUND OF THE INVENTION

In resonant tunneling diodes, the valley current is a leakage current that degrades performance. It is believed that the valley or leakage current has several origins, such as conduction through defects in the barrier, phonon assisted tunneling, thermally excited tunneling, hole conduction and others. Generally, a resonant tunneling diode, of the double barrier type, includes an injection layer, a first tunneling barrier layer, a quantum well, a second tunneling barrier layer and a collector layer all sandwiched together in the listed order. In an InAs-AlSb-GaSb-AlSb-InAs double barrier diode, for example, the electron confinement is good while hole confinement is poor.

With bias applied to the double barrier diode, normal current flows in the following manner. When the bias is sufficient to approximately align the ground state for holes in the quantum well with electrons in the conduction band of the injection layer, resonant tunneling occurs. That is, resonant tunneling occurs when one of the electron bands in the injection layer has the same energy as the ground state for holes in the quantum well. Then an electron from the filled ground state can transfer to the collector layer and an electron from the injection layer can replace the transferred electron.

Valley current occurs if the hole that is created in the quantum well moves to the negative terminal, the injection layer in this example. Further, as the bias increases, the barrier to holes decreases in height and thickness and valley current increases even more.

SUMMARY OF THE INVENTION

It is a purpose of the present invention to provide a new and improved resonant tunneling diode with reduced valley current.

It is a further purpose of the present invention to provide a new and improved resonant tunneling diode with reduced valley current by introducing a complex band edge to extend the effective barrier into the valence band.

The above problems and others are solved and the above purposes and others are realized in a resonant tunneling diode having a quantum well sandwiched between first and second tunnel barrier layers and the quantum well and tunnel barrier layers sandwiched between an injection layer and a collector layer with the improvement including a relatively thin layer of semiconductor material sandwiched between one of the first tunnel barrier layer and the injection layer and the first tunnel barrier layer and the quantum well. The relatively thin layer of semiconductor material has a valence band with an energy level lower than the valence band of the first tunnel barrier layer.

BRIEF DESCRIPTION OF THE DRAWINGS

Referring to the drawings.

DESCRIPTION OF THE PREFERRED EMBODIMENTS

Figure 1:
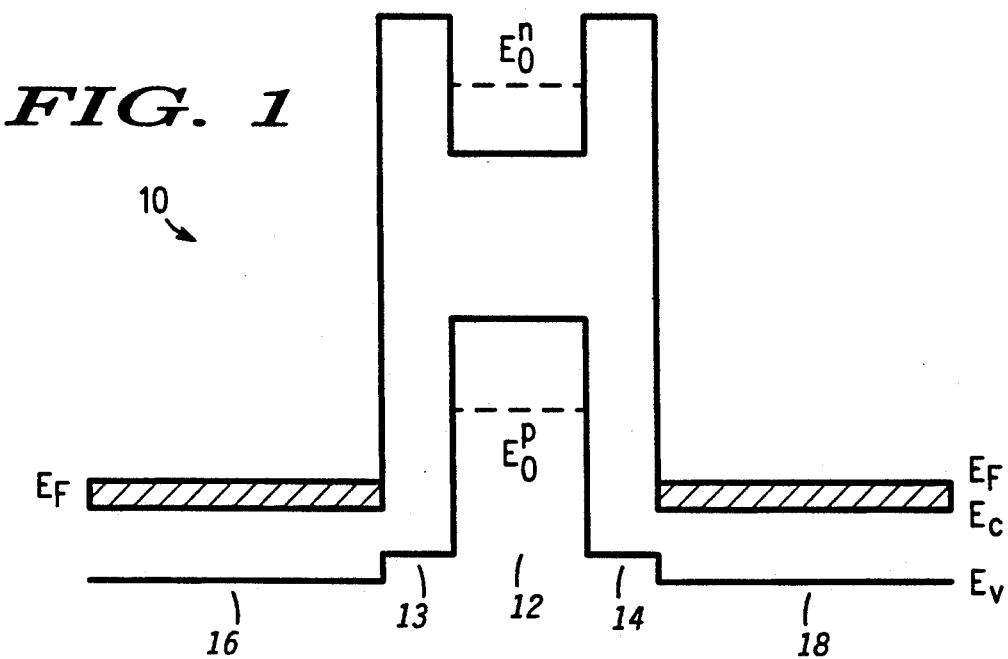
FIG. 1 illustrates a typical energy level diagram for a double barrier, resonant tunneling diode.

Referring specifically to FIG. 1, an energy diagram for a resonant tunneling diode 10 is illustrated. As is well known in the art, the lower energy line, designated $E_v$, represents the upper edge of the valence band of the various layers of material while the upper line, designated $E_c$, represents the lower edge of the conduction band. The vertical space between line $E_c$ and line $E_v$ is referred to as the bandgap and is a forbidden area for carriers. A third line, designated $E_F$, represents the Fermi energy level and the area between the line $E_F$ and the line $E_v$ is crosshatched to indicate the presence of electrons, which in this specific example are the majority carriers.

Diode 10 includes a quantum well 12, which in this example is GaSb. Quantum well 12 is sandwiched between first and second tunnel barrier layers 13 and 14, respectively, which in this example are both composed of AlSb. Diode 10 further includes an injection layer 16 and a collector layer 18, both of which are composed of InAs and are positioned in engagement with first and second tunnel barrier layers 13 and 14, respectively. Positioning injection layer 16 in engagement with first tunnel barrier layer 13 and collector layer 18 in engagement with second tunnel barrier layer 14 results in having first and second tunnel barrier layers 13 and 14 and quantum well 12 sandwiched between injection layer 16 and collector layer 18.

As is known in the art, the layer of material forming quantum well 12 is made very thin in order to form discrete energy levels therein by the size quantization effect. In this example, the ground state for holes is designated $E_0^p$ and the ground state for electrons is designated $E_0^n$. Tunnel barrier layers 13 and 14 are formed of material with a wide enough bandgap so that each of the layers acts like an insulator, but layers 13 and 14 are thin enough so that carriers can tunnel through layers 13 and 14. Diode 10 in FIG. 1 is in the state of equilibrium, i.e. no bias is being applied, and, therefore, the ground state for holes in quantum layer 12 is not aligned with the electrons (shaded area) in injection layer 16 and no current flows.

Figure 2:
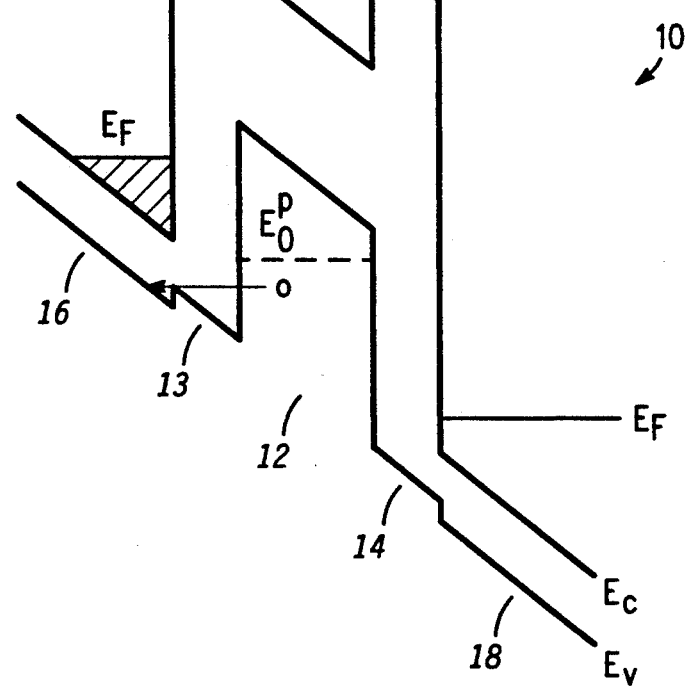
FIG. 2 illustrates the energy level diagram of FIG. 1 with a bias applied thereto.

Referring now to FIG. 2, diode 10 of FIG. 1 is illustrated with an appropriate bias applied. In this example an appropriate bias is a voltage applied so that collector layer 18 is positive with respect to injection layer 16. The bias draws the right side of the energy diagram down as shown in FIG. 2. In this state, line $E_0^p$ is aligned with the electrons below the Fermi level $E_F$ (cross hatched area). Thus, when one of the electron bands has the same energy level as line $E_0^p$, tunneling through tunnel barrier 13 occurs. Electrons in the filled quantum well 12 transfer to collector layer 18 through tunnel barrier layer 14 and more electrons replace the transferred electrons from injection layer 16.

Bias on diode 10 draws the right side of the energy diagram (collector 18) down and the bandgaps of tunnel barrier layer 13 and injection layer 16 are skewed so that there is less distance (bandgap) between the ground state for holes (line $E_0^p$) and the valence band of injection layer 16. Holes, which are created in quantum well 12 by the transfer of electrons to collector layer 18, have a positive charge and are, therefore, attracted to the negative terminal (injection layer 16) of diode 10. When these holes move through the reduced bandgap to injection layer 16, the resulting current is referred to as valley current. As the bias is increased and the right side of the energy diagram (collector 18) is drawn farther down, the bandgaps of tunnel barrier layer 13 and injection layer 16 are skewed farther so that there is less distance (bandgap) between the ground state for holes (line $E_0^p$) and the valence band of injection layer 16. Thus, as the bias is increased valley current increases.

Figure 3:
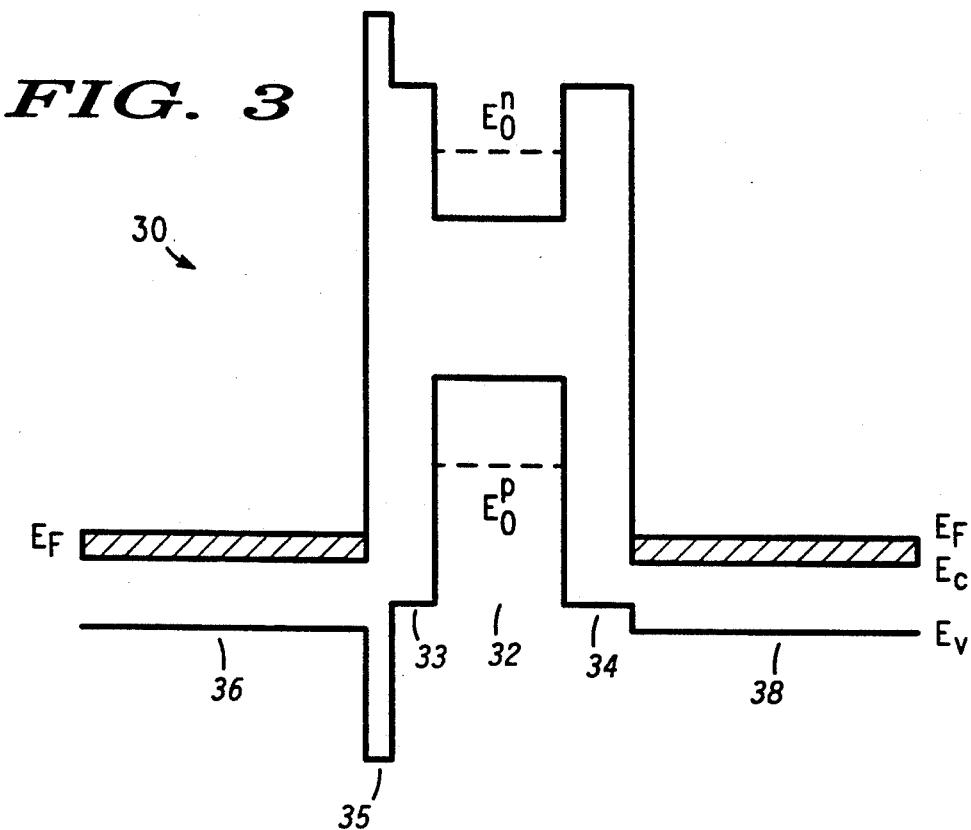
FIGS. 3, 4 and 5 illustrate three embodiments of a double barrier, resonant tunneling diode embodying the present invention.

Referring specifically to FIG. 3, a double barrier, resonant tunneling diode 30, embodying the present invention, is illustrated. Diode 30 includes a quantum well 32 sandwiched between first and second tunnel barrier layers 33 and 34, respectively. A minority carrier barrier layer 35 is sandwiched between first tunnel barrier layer 33 and an injection layer 36. Minority carrier barrier layer 35 is a thin layer of semiconductor material having a large bandgap relative to first tunnel barrier layer 33. In particular, minority carrier barrier layer 35 should have a valence band with an energy level lower than the energy level of the valence band of first tunnel barrier layer 33. A collector layer 38 is positioned in engagement with second tunnel barrier layer 34, so that second tunnel barrier layer 34 is sandwiched between quantum well 32 and collector layer 38.

Figure 4:
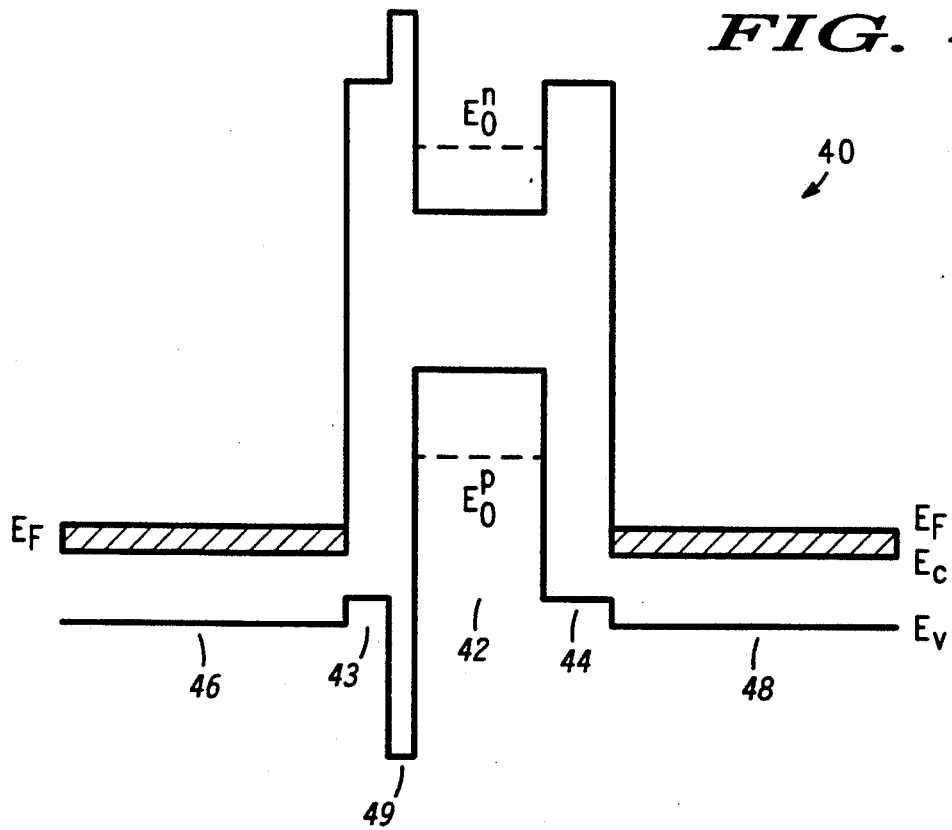

Referring specifically to FIG. 4, a double barrier, resonant tunneling diode 40, also embodying the present invention, is illustrated. Diode 40 includes a quantum well 42 and first and second tunnel barrier layers 43 and 44, respectively. An injection layer 46 is positioned in engagement with first tunnel barrier layer 43 and a collector layer 48 is positioned in engagement with second tunnel barrier layer 44, so that second tunnel barrier layer 44 is sandwiched between quantum well 42 and collector layer 48. A minority carrier barrier layer 49 is sandwiched between first tunnel barrier layer 43 and quantum well 42. Minority carrier barrier layer 49 is a thin layer of semiconductor material having a valence band with an energy level lower than the energy level of the valence band of first tunnel barrier layer 43.

In the specific examples illustrated in FIGS. 3 and 4, quantum wells 32 and 42 are layers of GaSb approximately 65Å thick, first tunnel barrier layers 33 and 43 are AlSb approximately 15Å thick and second tunnel barrier layers 34 and 44 are AlSb approximately 25Å thick. Injector layers 36 and 46 and collector layers 38 and 48 are InAs. Minority carrier barrier layers 35 and 49, which in this embodiment are both hole barriers, are each a layer of AlAs approximately 5.7Å thick. Because there can be a large lattice mismatch, of as much as 7%, between minority carrier barrier layer 35 (AlAs) and tunnel barrier layer 33 (AlSb) and between minority carrier layer 49 (AlAs) and quantum well 42 (GaSb), the thickness of the minority carrier barrier layer should be less than or equal to the critical thickness, $h_c$, or, in this specific example, about 2 monolayers. A monolayer of AlAs is approximately 2.83Å so that two monolayers is approximately 5.7Å.

Figure 5:
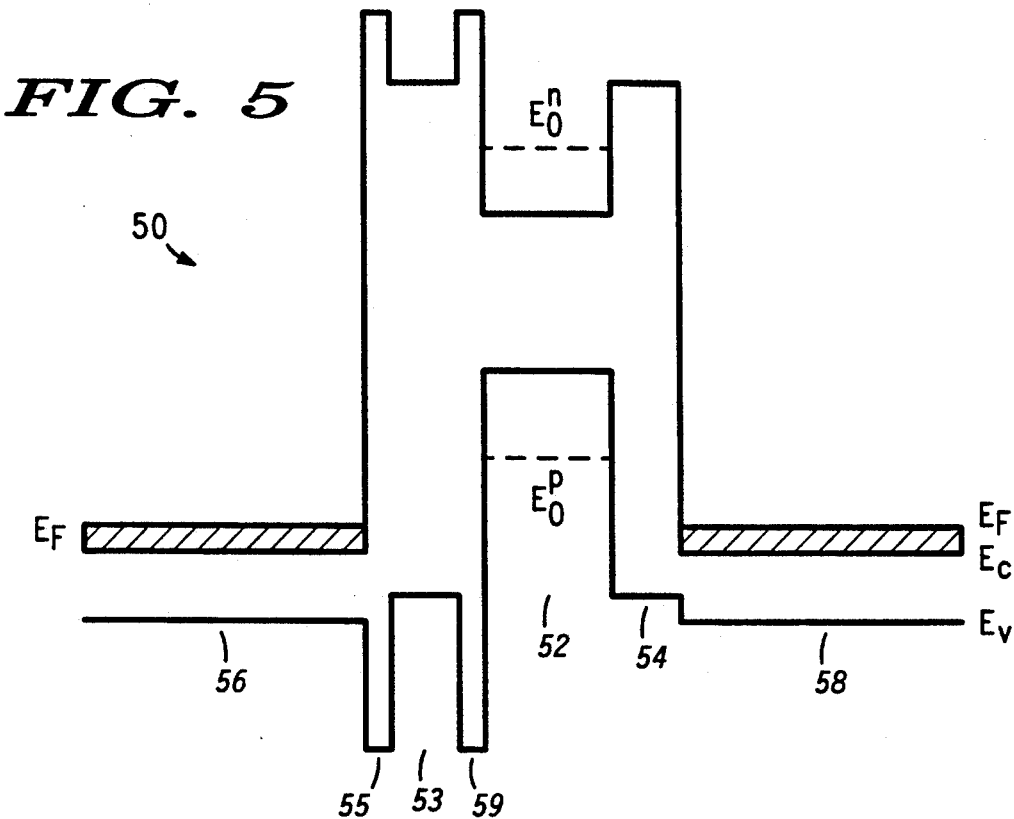

Referring specifically to FIG. 5, another double barrier, resonant tunneling diode 50, also embodying the present invention, is illustrated. Diode 50 includes a quantum well 52 and first and second tunnel barrier layers 53 and 54, respectively. A first minority carrier barrier layer 55 is sandwiched between first tunnel barrier layer 53 and an injection layer 56. A collector layer 58 is positioned in engagement with second tunnel barrier layer 54, so that second tunnel barrier layer 54 is sandwiched between quantum well 52 and collector layer 58. A second minority carrier barrier layer 59 is sandwiched between first tunnel barrier layer 53 and quantum well 52. First and second minority carrier barrier layers 55 and 59 are thin layers of semiconductor material having a valence band with an energy level lower than the energy level of the valence band of first tunnel barrier layer 53.

Figure 6:
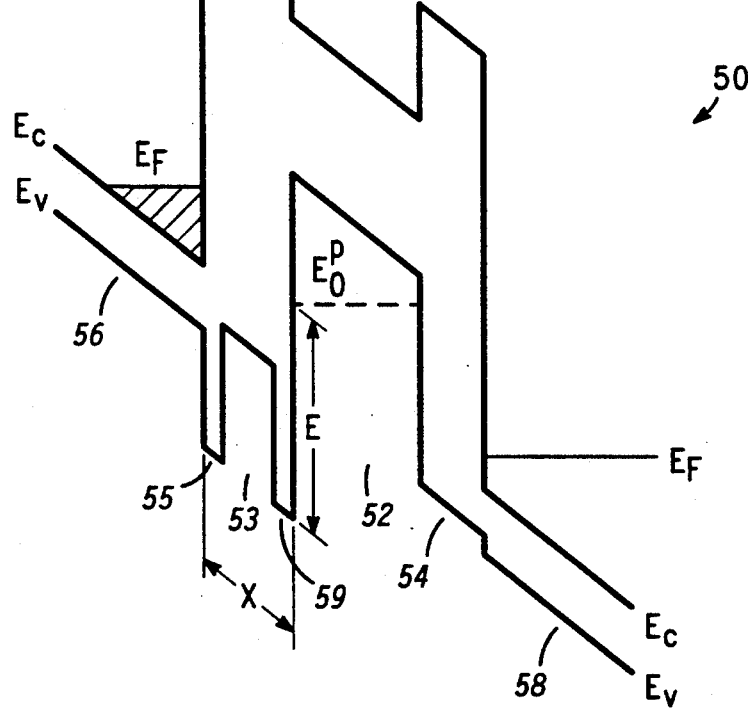
FIG. 6 illustrates the double barrier, resonant tunneling diode with a bias applied thereto.

The various embodiments of double barrier, resonant tunneling diodes illustrated in FIGS. 3, 4 and 5 are all in the equilibrium state (no bias applied). In FIG. 6, diode 50 is illustrated with an appropriate bias applied to illustrate the effect of minority carrier barrier layers 55 and 59. Essentially, minority carrier barrier layers 55 and 59 increase the effective barrier height for minority carriers travelling toward the negative terminal (injection layer 56). In general, the minority carrier current I across the barrier into injection layer 56 is determined by a reflection factor R and a transmission coefficient T defined as:

$$T \sim e^{-\kappa X}$$

where x is the width of the barrier as illustrated in FIG. 6 and $\kappa$ is defined as:

$$\kappa = \sqrt{\frac{2mE}{h^2}}$$

where h is Planck's constant, m is the mass of a minority particle and E is the depth of the barrier below the ground state for holes (line $E_0^p$) as illustrated in FIG. 6.

Some actual comparisons of diodes 10 of FIG. 1 and diode 30 of FIG. 3, were made. In two examples of diode 10 (without a minority carrier barrier layer) a peak current to valley current ratio was determined to be approximately 9 and 12. In two similar examples of diode 30 (with a minority carrier barrier layer 35), the peak current to valley current ratio was 12 and 15, respectively. Thus, the peak current to valley current ratio was increased by approximately 30% by the addition of minority carrier barrier layer 35. The single minority carrier barrier layer increases reflection and reduces transmission. A similar improvement can be achieved with the embodiment of diode 40 illustrated in FIG. 4.

The reduction of minority carrier current (valley current) is further reduced by incorporating both minority carrier barrier layers into the diode, as illustrated in diode 50 of FIG. 5. By using two minority carrier barrier layers, a quantum well is formed and the ground state (line $E_0^p$) for holes (minority carriers in this embodiment) remains close to the bandgap edge because the hole effective mass is high. Also, the quantum well formed by the double minority carrier barrier layer has forbidden transfer regions as well as additional eigenstates. Thus, double minority carrier barrier layer diode 50 increases hole reflection and, in addition, further reduces hole transmission by introducing regions that are forbidden.

While the specific examples given were n-p-n resonant tunneling diodes in which the minority carriers are holes, it will be understood by those skilled in the art that the disclosed structure can easily be incorporated into p-n-p type resonant tunneling diodes. In p-n-p type resonant tunneling diodes the minority carriers are electrons but, because the energy level diagrams are essentially the same as FIG. 6 turned upside-down, the same theory applies.

Thus, a resonant tunneling diode is disclosed in which the peak current to valley current ratio has been increased by approximately 30%. A further increase in the ratio is possible by incorporating two minority barrier carrier layers into the diode on either side of the tunnel barrier layer. The minority carrier barrier layers are relatively easy to incorporate into a resonant tunneling diode because lattice mismatches as high as 7% can be tolerated by keeping the thickness of the minority carrier barrier layers less than or equal to $h_c$. The resonant tunneling diodes disclosed, therefore, have substantially reduced leakage current.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. In a resonant tunneling diode having a quantum well sandwiched between first and second tunnel barrier layers and the quantum well and tunnel barrier layers sandwiched between an injection layer and a collector layer, the improvement comprising a relatively thin layer of semiconductor material sandwiched between the first tunnel barrier layer and the injection layer and having a bandgap which is large relative to a bandgap of the first tunnel barrier layer.

2. In a resonant tunneling diode having a quantum well sandwiched between first and second tunnel barrier layers and the quantum well and tunnel barrier layers sandwiched between an injection layer and a collector layer, the improvement comprising a relatively thin layer of semiconductor material sandwiched between one of the first tunnel barrier layer and the injection layer and the first tunnel barrier layer and the quantum well, and having a valence band with an energy level lower than a valence band of the first tunnel barrier layer.

3. The improvement as claimed in claim 2 wherein the relatively thin layer of semiconductor material has a thickness in the range of approximately 2 monolayers.

4. The improvement as claimed in claim 3 wherein the relatively thin layer of semiconductor material includes a layer of AlAs less than approximately 5.7 angstroms thick.

5. The improvement as claimed in claim 2 wherein the relatively thin layer of semiconductor material has a lattice mismatch relative to the quantum well of less than approximately 7%.

6. The improvement as claimed in claim 2 including in addition a second relatively thin layer of semiconductor material sandwiched between the other of the first tunnel barrier layer and the injection layer, and the first tunnel barrier layer and the quantum well, the second relatively thin layer of semiconductor material having a valence band with an energy level lower than the valence band of the first tunnel barrier layer.

7. The improvement as claimed in claim 6 wherein the first relatively thin layer of semiconductor material and the second relatively thin layer of semiconductor material both have a thickness in the range of approximately 2 monolayers.

8. The improvement as claimed in claim 7 wherein the first relatively thin layer of semiconductor material and the second relatively thin layer of semiconductor material both include a layer of AlAs less than approximately 5.7 angstroms thick.

9. The improvement as claimed in claim 7 wherein the first relatively thin layer of semiconductor material and the second relatively thin layer of semiconductor material both have a lattice mismatch relative to the quantum well of less than approximately 7%.

10. A resonant tunnel diode with reduced valley current as claimed in claim 2 wherein the collector and injection layers are both N-type conduction material and the quantum well is P-type conduction material.

11. A resonant tunnel diode with reduced valley current as claimed in claim 2 wherein the collector and injection layers are both P-type conduction material and the quantum well is N-type conduction material.

12. A resonant tunnel diode with reduced valley current comprising;
   first and second tunnel barrier layers and a quantum well sandwiched therebetween, the first tunnel barrier layer being formed of material having a valence band at a predetermined energy level;
   a collector layer positioned in engagement with the second tunnel barrier layer;
   an injection layer; and
   a minority carrier barrier layer sandwiched between the injection layer and the first tunnel barrier layer, the minority carrier barrier layer having a valence band at an energy level lower than the valence band of the first tunnel barrier layer.

13. A resonant tunnel diode with reduced valley current comprising;
   first and second tunnel barrier layers and a quantum well, the first tunnel barrier layer being formed of material having a valence band at a predetermined energy level;
   an injection layer positioned in engagement with the first tunnel barrier layer;
   a collector layer;
   a minority carrier barrier layer sandwiched between the first tunnel barrier layer and the quantum well and the second tunnel barrier layer being sandwiched between the quantum well and the collector layer, and the minority carrier barrier layer having a valence band at an energy level lower than the valence band of the first tunnel barrier layer.

14. A resonant tunnel diode with reduced valley current comprising;
   first and second tunnel barrier layers and a quantum well, the first tunnel barrier layer being formed of material having a valence band at a predetermined energy level;
   an injection layer;
   a collector layer;
   a first minority carrier barrier layer sandwiched between the injection layer and the first tunnel barrier layer;
   a second minority carrier barrier layer sandwiched between the the first tunnel barrier layer and the quantum well;
   the first and second minority carrier barrier layers each having a valence band at an energy level lower than the valence band of the first tunnel barrier layer; and
   the second tunnel barrier layer being sandwiched between the quantum well and the collector layer.

* * * * *